(12) United States Patent
Liao

(10) Patent No.: US 11,417,594 B2
(45) Date of Patent: Aug. 16, 2022

(54) 3DIC PACKAGE INTEGRATION FOR HIGH-FREQUENCY RF SYSTEM

(71) Applicant: TAIWAN SEMICONDUCTOR MANUFACTURING CO., LTD., Hsinchu (TW)

(72) Inventor: Wen-Shiang Liao, Miaoli County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 641 days.

(21) Appl. No.: 16/200,098

(22) Filed: Nov. 26, 2018

(65) Prior Publication Data

US 2019/0096794 A1 Mar. 28, 2019

Related U.S. Application Data

(62) Division of application No. 13/940,413, filed on Jul. 12, 2013, now Pat. No. 10,475,732.

(51) Int. Cl.
*H01L 23/498* (2006.01)
*H01L 23/14* (2006.01)

(52) U.S. Cl.
CPC ........ *H01L 23/49827* (2013.01); *H01L 23/14* (2013.01); *H01L 23/49822* (2013.01); *H01L 2224/13* (2013.01); *Y10T 29/49165* (2015.01)

(58) Field of Classification Search
CPC . H05K 3/4038–4084; H05K 3/42–429; H05K 3/40–429; Y10T 29/49165; Y10T 29/4913–49146; H01L 23/49827; H01L 23/14; H01L 23/49822; H01L 2224/13

USPC ............ 29/852, 832–841, 877–880; 438/464
See application file for complete search history.

(56) References Cited

U.S. PATENT DOCUMENTS

| | | |
|---|---|---|
| 6,943,108 B2 | 9/2005 | Farooq et al. |
| 7,690,109 B2 | 4/2010 | Mori et al. |
| 8,411,459 B2 | 4/2013 | Yu et al. |
| 8,519,542 B2 | 8/2013 | Kim et al. |
| 9,101,068 B2 | 8/2015 | Yun et al. |
| 10,475,732 B2 * | 11/2019 | Liao .................... H01L 23/14 |
| 2003/0086248 A1 | 5/2003 | Mashino |
| 2010/0109142 A1 * | 5/2010 | Toh .................... H01L 21/563 |
| | | 257/690 |
| 2011/0056068 A1 | 3/2011 | Shioga et al. |
| 2011/0079917 A1 | 4/2011 | Xia et al. |
| 2011/0204499 A1 | 8/2011 | Lee |
| 2011/0205028 A1 * | 8/2011 | Pagani ............. H01L 23/5227 |
| | | 340/10.1 |
| 2012/0106117 A1 | 5/2012 | Sundaram et al. |
| 2012/0163535 A1 * | 6/2012 | Kaneko ............. A61B 6/4291 |
| | | 378/62 |

(Continued)

*Primary Examiner* — Minh N Trinh
(74) *Attorney, Agent, or Firm* — Maschoff Brennan

(57) ABSTRACT

A three-Dimensional Integrated Circuit (3DIC) Chip on Wafer on Substrate (CoWoS) packaging structure or system includes a silicon oxide interposer with no metal ingredients, and with electrically conductive TVs and RDLs. The silicon oxide interposer has a first surface and a second surface opposite to the first surface. The electrically conductive TVs penetrate through the silicon oxide interposer. The electrically interconnected RDLs are disposed over the first surface of the silicon oxide interposer, and are electrically coupled or connected to a number of the conductive TVs.

20 Claims, 11 Drawing Sheets

(56) References Cited

U.S. PATENT DOCUMENTS

| | | | |
|---|---|---|---|
| 2012/0234589 A1* | 9/2012 | Furuichi | H05K 3/4682 |
| | | | 174/261 |
| 2012/0247814 A1* | 10/2012 | Shimizu | H05K 3/4644 |
| | | | 174/251 |
| 2013/0168860 A1 | 7/2013 | Karikalan et al. | |
| 2013/0267046 A1* | 10/2013 | Or-Bach | H01L 27/11526 |
| | | | 438/14 |
| 2019/0096794 A1* | 3/2019 | Liao | H01L 23/49827 |

\* cited by examiner

3DIC PACKAGE INTEGRATION FOR HIGH-FREQUENCY RF SYSTEM

PRIORITY CLAIM AND CROSS-REFERENCE

This is a divisional application of U.S. patent application Ser. No. 13/940,413 filed on Jul. 12, 2013, now U.S. Pat. No. 10,475,732, issued on Nov. 12, 2019, which is incorporated herein by reference in its entirety.

BACKGROUND

A three-Dimensional Integrated Circuit (3DIC) Chip on Wafer on Substrate (CoWoS) packaging structure or system may accommodate multiple heterogeneous systems such as logic, memory, analog, RF, and micro-electrical mechanical systems. Having a three-dimensional arrangement allows these systems to communicate with each other across a vertical dimension. Some 3DIC designs utilize a silicon interposer to connect dies and electronic components. However, for high frequency (for example, greater 2.4 GHz) RF applications, the semiconducting nature of the silicon interposer causes electrical loss resulting in RF signal degradation. A glass interposer is an alternative to overcome the lossy shortcoming of the lower resistivity silicon interposer, because it has lower signal attenuation (due to high resistivity of the glass substrate) as compared to silicon. The glass interposer needs many through-glass vias (TGVs) to connect dies and electronic components on two sides of the glass interposer. The TGVs can be formed by dry etching, wet etching or laser drilling. Because plasma etches glass at a very slow rate, the dry etching is inefficient. The wet etching is an isotropic etching process, resulting in large TGVs with very rough sidewall surfaces. The laser drilling can cause glass frit contamination to the glass interposer, and are time consuming because the lasers drill the TGVs one at a time. Thus, in general, conventional glass interposers may face the problems of slow processing speed, laser damage to glass, non-uniform through-glass via (TGV) profiles, glass contamination result from laser ablation, and very slow etching rate which may need a thicker metal hard mask.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1A:
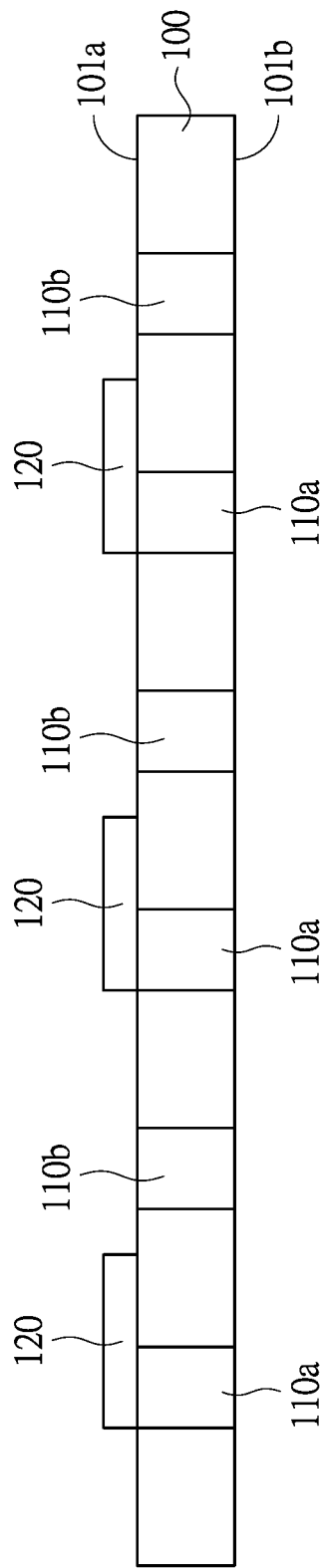
FIG. 1A and FIG. 1B are schematic cross-sectional views of packaging structures according to various embodiments.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed.

A conventional glass interposer includes silicon oxide, metal ingredients and/or additives. The metal ingredients, such as lithium, sodium, potassium, cerium, silver, arsenic, vanadium, copper, manganese or aluminum, are used for various purposes such as strengthening or coloring the glass. The additives, such as potassium oxide ($K_2O$) or sodium oxide ($Na_2O$), are used for lowering the processing temperature of glass to, for example, 1100° C. During plasma etching, the plasma used for etching silicon oxide may not effectively etch the metal ingredients, thus lowering the etching rate of the conventional glass interposer relative to silicon oxide. Meanwhile, the metal ingredients and the additives may be ionized and become mobile ions which are harmful to electronic devices between which the interposer is disposed.

Embodiments of the present disclosure are directed to using a deposition process to fabricate a silicon oxide interposer which can fully confine RF signals with very little transmission signal loss. The deposition process can form high purity silicon oxide which does not contain any metal ingredient or mobile ions. The thickness of the silicon oxide interposer can be controlled to be relatively thin or thick by the concentration of deposition material and conditions of the deposition process. In view of the foregoing reasons, the etching rate of the silicon oxide interposer is higher than the conventional glass interposer, and thus methods for forming the silicon oxide interposer are cost effective due to higher throughputs during etching. In some embodiments, a spin on glass (SOG) process or a spin on dielectric (SOD) process and a curing process is used to form the silicon oxide interposer. In certain embodiments, one or more chemical vapor deposition (CVD) processes are used. Example CVD processes include a plasma enhanced CVD (PECVD) process, an atmospheric pressure plasma enhanced CVD (APCVD) process, a sub-atmospheric pressure plasma enhanced CVD (SACVD) process, a high density plasma CVD (HDPCVD) process, a low pressure CVD (LPCVD) process, or an atomic layer deposition (ALD) process, etc.

Figure 1B:
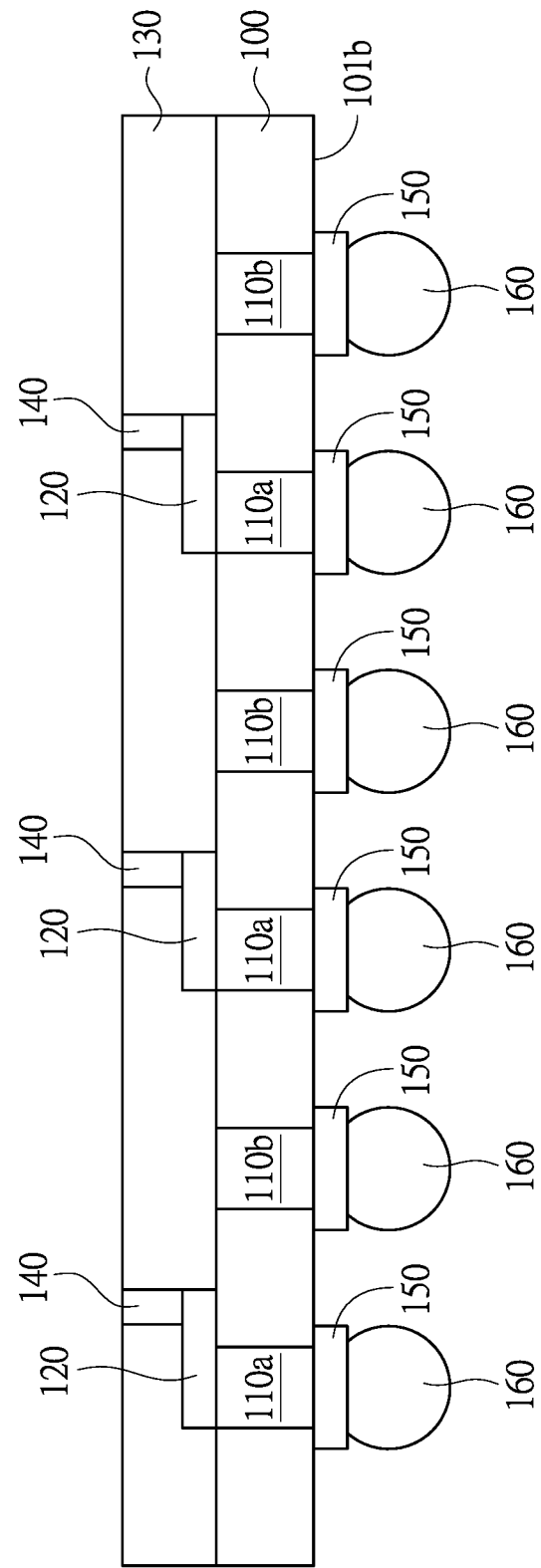

FIG. 1A and FIG. 1B are schematic cross-sectional views of packaging structures according to various embodiments. As shown in FIG. 1A, a packaging structure, such as a 3DIC CoWoS packaging structure or system, includes a silicon oxide interposer 100, conductive through vias (TVs) 110a and 110b, and redistribution lines (RDLs) 120. The silicon oxide interposer 100 is formed from a liquid-phase spin coating or deposition process, and thus does not contain any metal ingredient or mobile ions. In some embodiments, the silicon oxide interposer 100 is cured SOG or cured SOD. The silicon oxide interposer 100 has a first surface 101a and a second surface 101b opposite to the first surface 101a. The conductive TVs penetrate through the silicon oxide interposer 100 from the first surface 101a to the second surface 101b. The RDLs 120 are disposed over the first surface 101a of the silicon oxide interposer 100, and are electrically coupled to the conductive TVs 110a for re-routing signals. Although only one layer of RDLs 120 is shown, more than one layer of RDLs 120 may be formed. In some embodiments, active or passive electronic devices are attached over or in the silicon oxide interposer 100, such as an integrated circuit (IC) RF chip, a baseband or processor chip, a memory chip, an antenna, an inductor, a filter or a resistor, etc. The passive electronic devices may interconnect to the conductive TVs 110a or 110b and the RDLs 120 with conductive elements. For another example, a passive antenna may be embedded in the silicon oxide interposer 100 through a conductive TV 110a or 110b.

The silicon oxide interposer 100 has broad thickness range and may meet the requirements of various applications. In some embodiments, the silicon oxide interposer 100 may have a thickness ranging from about 1 µm to about 9000 µm. In some embodiments, the silicon oxide interposer 100 may have a thickness ranging from about 1 µm to about 1000 µm. In certain embodiments, the silicon oxide interposer 100 may have a thickness ranging from about 10 µm to about 500 µm. In certain embodiments, the silicon oxide interposer 200 may have a thickness ranging from about 20 µm to about 50 µm.

As shown in FIG. 1B, the packaging structure further includes a polymer insulating layer 130, interconnects 140, under bump metallurgy (UBM) layers 150 and conductive bumps 160. The interconnects 140 are formed in the polymer insulating layer 130, and are electrically coupled to the conductive TVs 110a through the RDLs 120. Die(s) may be bonded to the interconnects 140. In some embodiment, the polymer insulating layer 130 is formed of polybenzoxazole (PBO), epoxy, polyimide, benzocyclobutene (BCB), or the like. The UBM layers 150 are formed over the second surface 101b of the silicon oxide interposer 100, and are electrically coupled to the conductive TVs 110a and 110b. The usable materials of the UBM layers 150 include copper or copper alloys. However, other metals, such as silver, gold, aluminum, or combinations thereof, may also be included. The conductive bumps 160, such as Sn/Pb or Sn/Ag solder bumps, are disposed over the UBM layers 150, and are electrically coupled to the conductive TVs 110a and 110b. In some embodiments, the conductive bumps 160 may be micro bumps or C4 (Controlled Collapse Chip Connection) bumps.

Figure 1C:
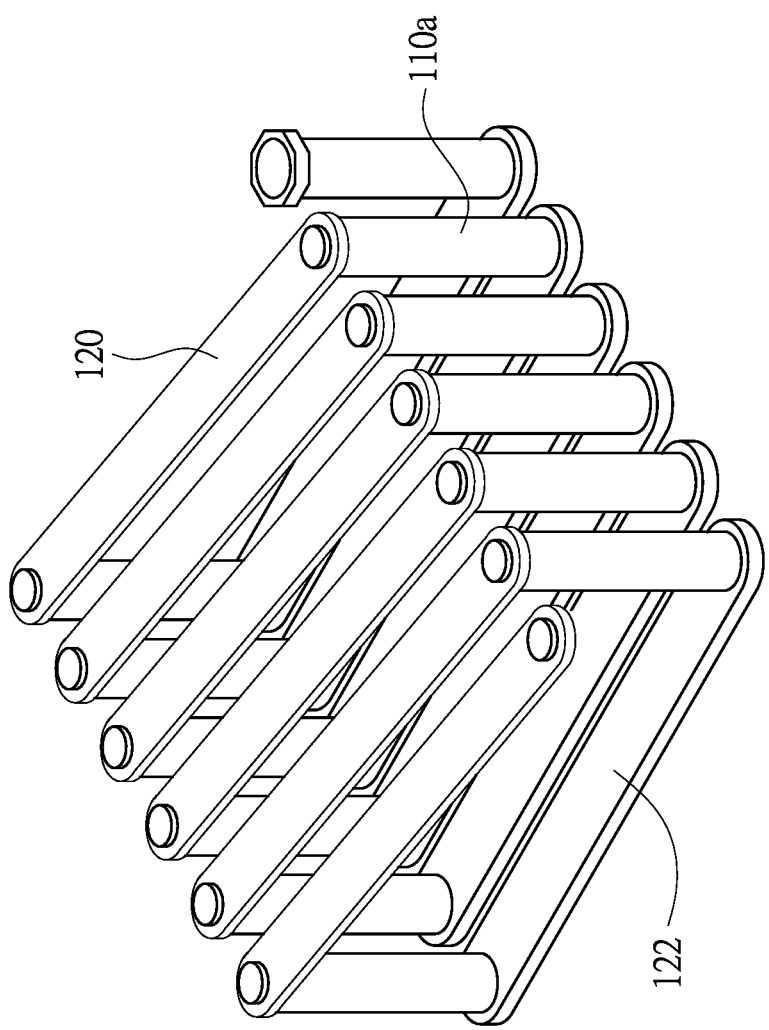
FIG. 1C is a schematic view of a three-dimensional (3D) vertical inductor according to various embodiments.

As shown in FIG. 1C, a 3D vertical inductor is formed from the RDLs 120 on a top surface, the conductive TVs 110a and copper elements 122 on a bottom surface. The RDLs 120 are connected to the copper elements 122 through the conductive TVs 110a. Because the silicon oxide interposer is free of metal ingredients and mobile ions, the silicon oxide interposer can be etched faster, and the formation of conductive interconnection lines and passive electronic devices take relatively less time.

Figure 2A:
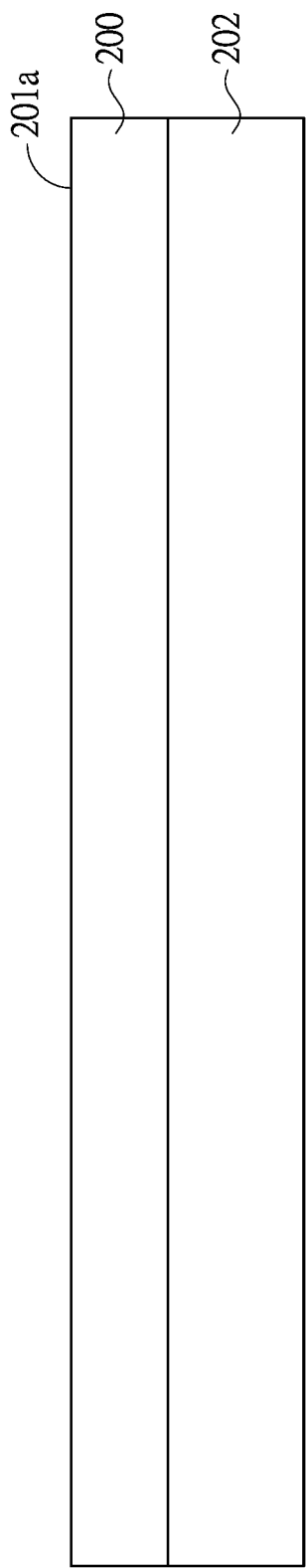
FIG. 2A-FIG. 2I are schematic cross-sectional views of intermediate stages according to a method for fabricating a packaging structure in some embodiments.

FIG. 2A-FIG. 2H are schematic cross-sectional views of intermediate stages according to a method for fabricating a packaging structure in some embodiments. As shown in FIG. 2A, a silicon oxide interposer 200 (which is a silicon oxide layer) is first spin coated or deposited on a temporary carrier 202. The temporary carrier 202 may be any commonly used carrier that is different from a silicon oxide wafer, such as a silicon wafer, as long as the silicon oxide interposer 200 can be spin coated or deposited thereon. The temporary carrier 202 will be removed in a subsequent process. In some embodiments, for recycling the temporary carrier 202, a polymer buffer layer may be formed on the temporary carrier 202 before the silicon oxide interposer 200 is deposited on the temporary carrier 202, such that the polymer buffer layer can be removed to separate the temporary carrier 202 from the silicon oxide interposer 200 in the subsequent process. The size of the temporary carrier 202 varies according to the size of manufactured wafer. For example, the temporary carrier 202 is a 12-inch dummy wafer for manufacturing a 12-inch semiconductor wafer. The silicon oxide interposer 200 is deposited on the temporary carrier 202 using a deposition process, such as an SOG process or SOD process with a curing process, a PECVD process, an APCVD process, a SACVD process, a HDPCVD process, a LPCVD process or an ALD process, etc. The liquid-phase SOG/SOD ingredients also can be tuned to strengthen the silicon oxide interposer 200 with through via structures. In some embodiments, the SOG process involves applying a liquid mixture of silicon dioxide in a solvent while the temporary carrier 202 is spin coated. The solvent evaporates in the curing process. In specific embodiments, the silicon oxide interposer 200 is formed by spin coating a poly (perhydrosilazane)-$(SiH_2NH)$ based inorganic SOD material designed by AZ Electronic Materials of Japan. A low temperature curing process follows at a curing temperature greater than 90° C. or 150° C., but below 400° C. For example, S05 series products of AZ Electronic Materials have cracking thresholds (@250° C.) greater than 50 µm, and thus a thick silicon oxide interposer 200 can be made using such products. However, embodiments of the present disclosure are not limited thereto. The silicon oxide interposer 200 may be provided to any suitable thickness and by any suitable liquid spin coating or deposition technique.

The silicon oxide interposer 200 can be easily fabricated to be very thin (for example, 20 µm-30 µm) for relatively shorter 3D IC CoWoS (Chip on Wafer on Substrate) interconnect paths. In some embodiments, the silicon oxide interposer 200 may have a thickness ranging from about 1 µm to about 9000 µm. In some embodiments, the silicon oxide interposer 200 may have a thickness ranging from about 1 µm to about 1000 µm. In certain embodiments, the silicon oxide interposer 200 may have a thickness ranging from about 10 µm to about 500 µm. In certain embodiments, the silicon oxide interposer 200 may have a thickness ranging from about 20 µm to about 50 µm. Because the technology for handling the spin coated or deposited silicon oxide is mature, the silicon oxide interposer 200 can be processed effectively in various semiconductor processes.

Figure 2B:
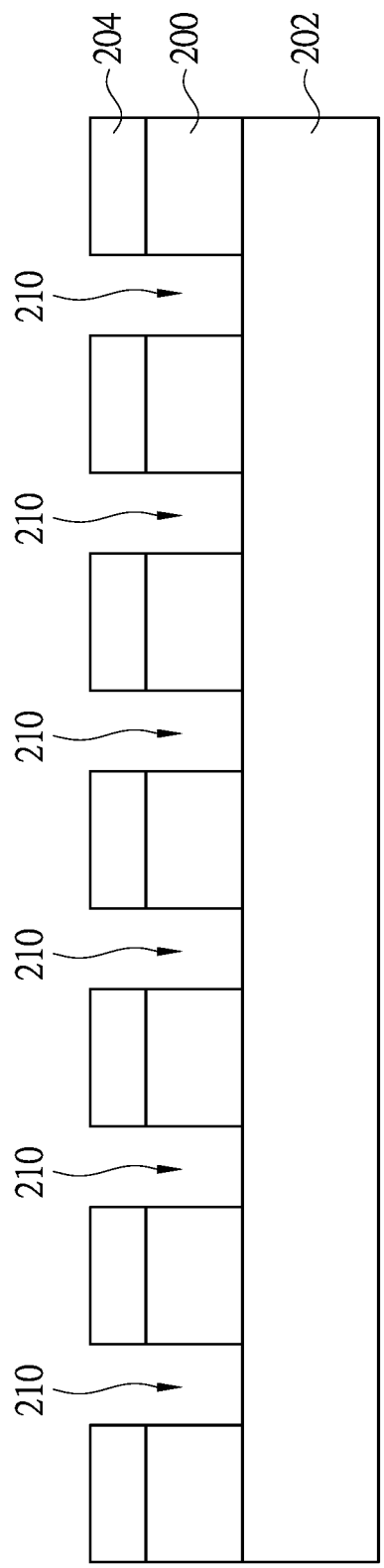
Figure 2C:
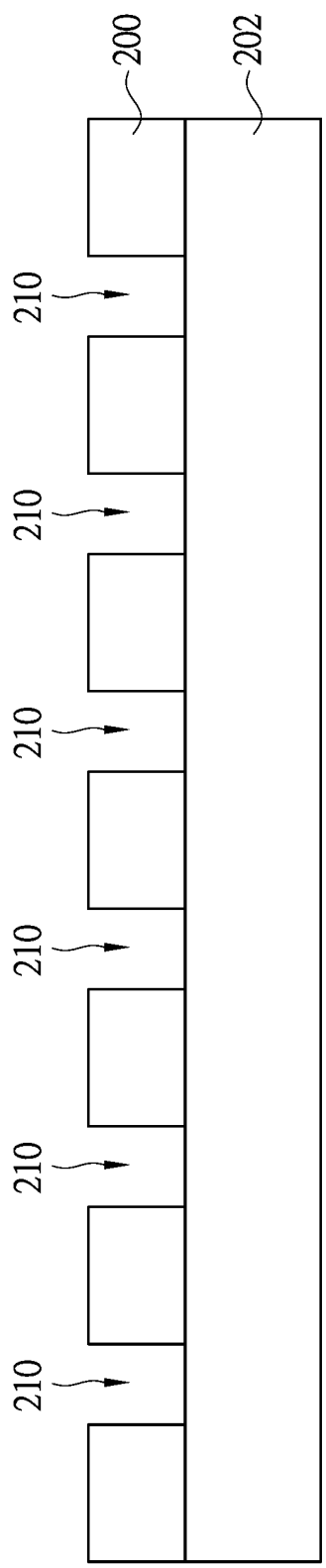

As shown in FIG. 2B, a patterned photoresist layer 204 is formed on a first surface 201a of the silicon oxide 200, and then an etching process is used to remove the areas of the silicon oxide 200 unprotected by the patterned photoresist layer 204, thereby forming TVs 210 penetrating through the silicon oxide interposer 200. The etching process can be any suitable dry etching process, such a deep reactive-ion etching (DRIE) process or an inductively couple plasma (ICP) etching process. In some embodiments, a metal hard mask, such as TiN, Ni, Cr or Ti/Cu, etc., may be used in performing the dry etching process. Thereafter, as shown in FIG. 2C, the patterned photoresist layer 204 is removed.

Figure 2D:
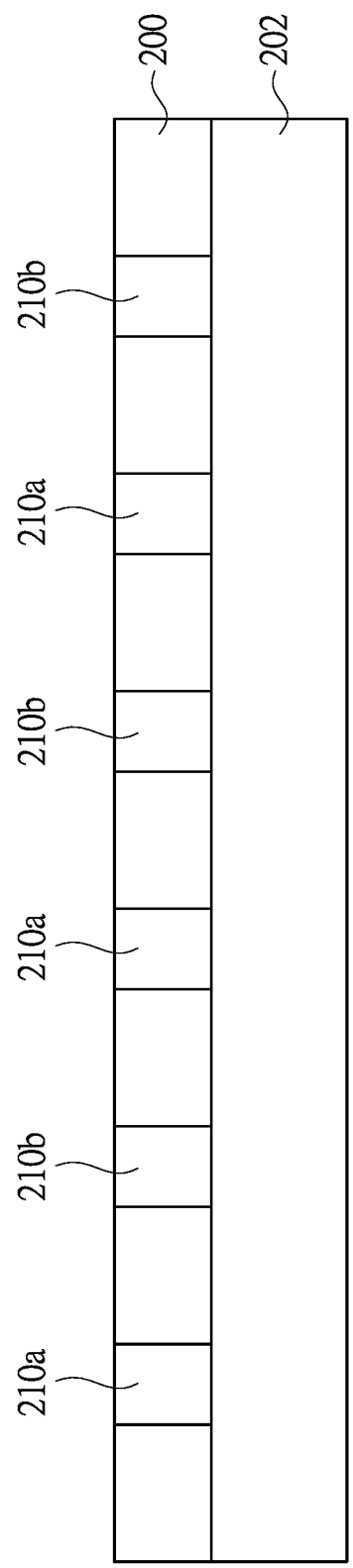
Figure 2E:
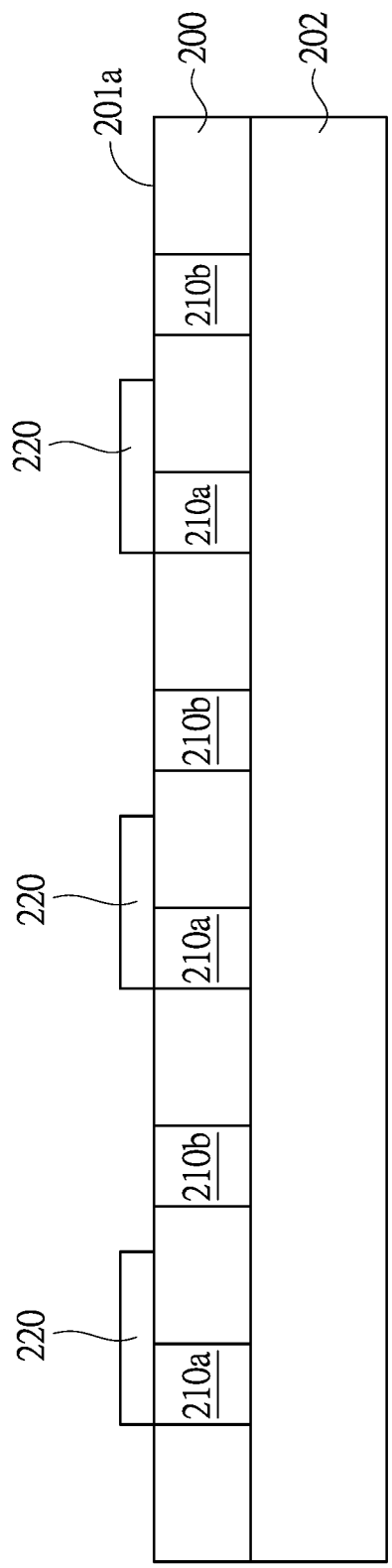

As shown in FIG. 2D, a conductive material fills the TVs 210 to form conductive TVs 210a and 210b. In some embodiments, a seed layer, Cu or Ti/Cu, is first deposited in each of the TVs 210 by physical vapor deposition (PVD), and then copper is used to fill the TVs 210 by electrochemical plating (ECP). However, embodiments of the present disclosure are not so limited. The conductive TVs 210a and 210b can be formed using any suitable conductive material and processes. As shown in FIG. 2E, RDLs 220 are formed over the first surface 201a of the silicon oxide interposer 200, and are electrically coupled to the conductive TVs 210a. Although only one layer of RDLs 220 is shown, more than one layer of RDLs 220 may be formed. The material forming the RDLs 220 is a metallic material, such as aluminum or copper. In some embodiments, copper is sputtered or electroplated and patterned on the first surface 201a of the silicon oxide interposer 200 to form the RDLs 220. In certain embodiments, both active and passive electronic devices may be attached over or into the silicon oxide interposer and electrically interconnected through using the conductive TVs 210a and 210b and the RDLs 220. The active electronic devices may include an integrated circuit (IC) RF chip, a baseband or processor chip, a memory chip, etc. The passive electronic devices may include an antenna, an inductor, a filter or a resistor, etc.

Figure 2F:
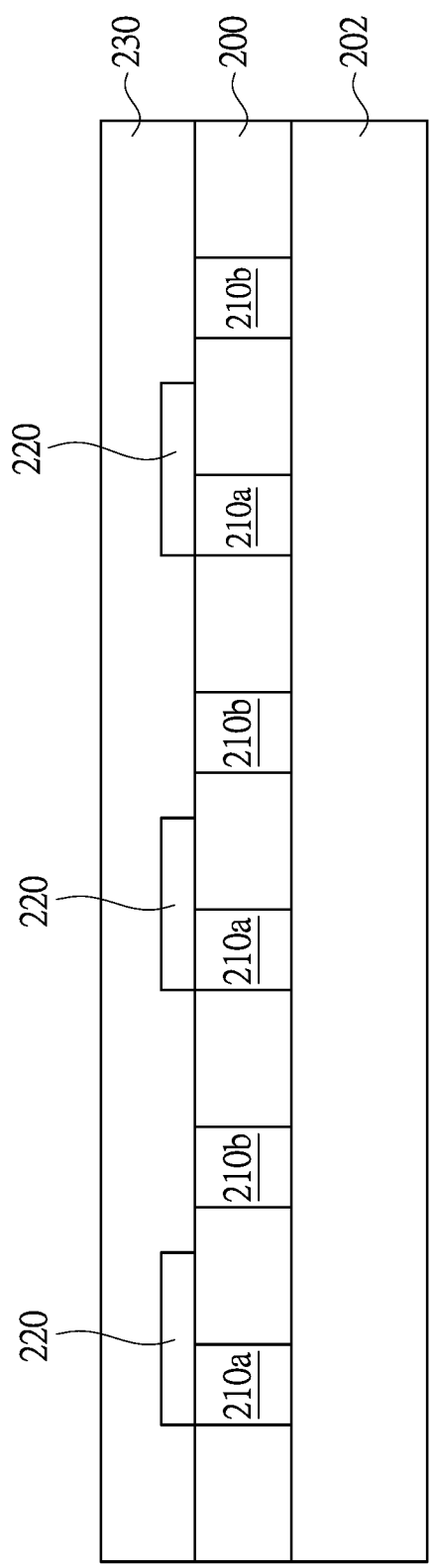
Figure 2G:
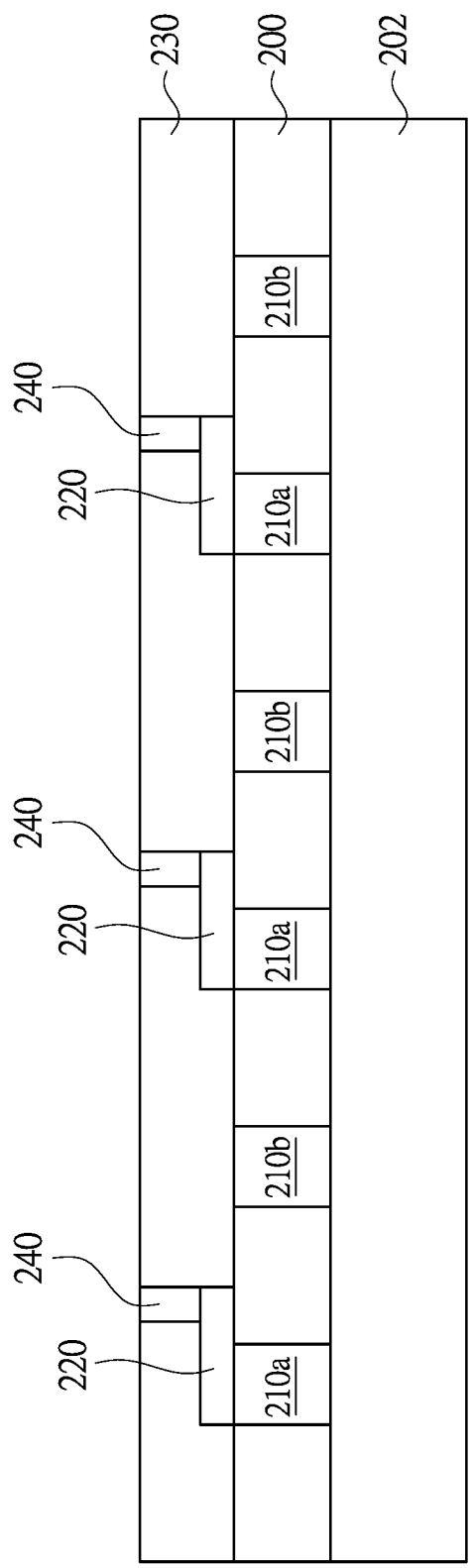

As shown in FIG. 2F, a polymer insulating layer 230 is coated or deposited over the silicon oxide interposer 200 to cover the RDLs 220. In some embodiments, the polymer insulating layer 230 includes PBO, epoxy, polyimide, benzocyclobutene (BCB), or the like. However, other suitable materials can also be used for forming the polymer insulating layer 230. As shown in FIG. 2G, interconnects 240 are formed in the polymer insulating layer 230, and are electrically coupled to the conductive TVs 210a via the RDLs 220. One or more dies may be bonded to the interconnects 240.

Figure 2H:
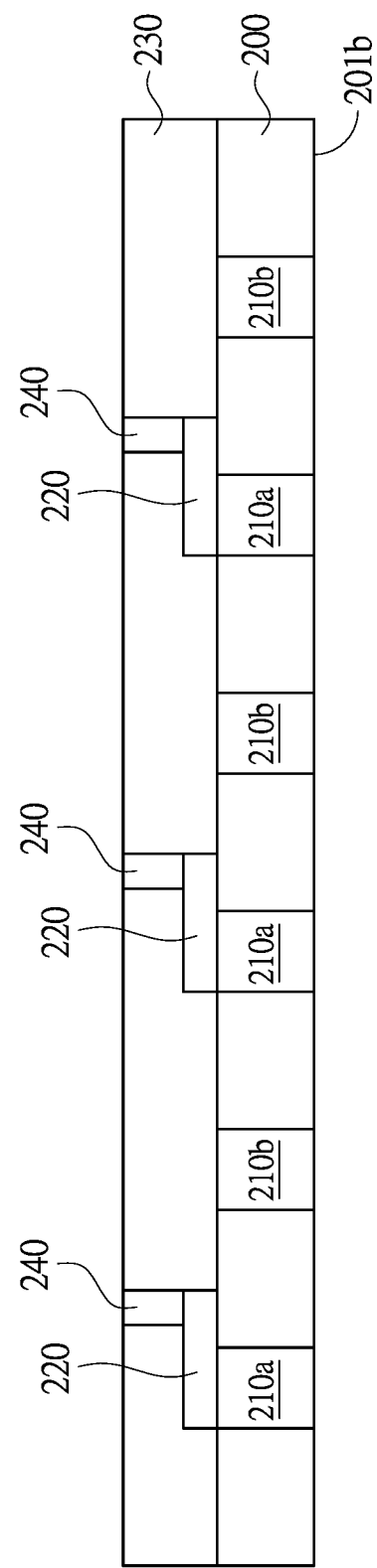

As shown in FIG. 2H, the temporary carrier 202 is removed from the silicon oxide interposer 200 after the polymer insulating layer 230 and the interconnects 240 are formed. However, in some embodiments, the temporary carrier 202 may be removed from the silicon oxide interposer 200 right after the RDLs 220 are formed, thus forming a device similar to that shown in FIG. 1A. The timing for the removal of the temporary carrier 202 can vary in accordance with the actual device requirements, as long as the silicon oxide interposer 200 can be processed alone without the support of the temporary carrier 20.

Figure 2I:
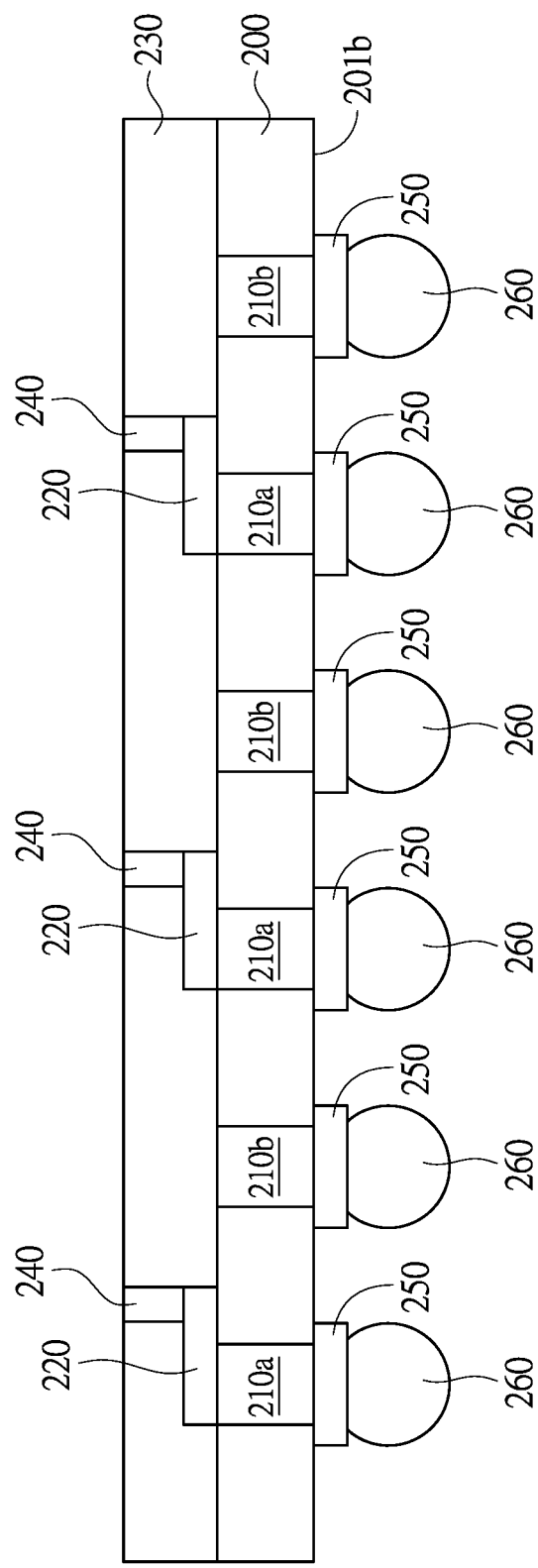

As shown in FIG. 2I, after the temporary carrier 202 is removed, the silicon oxide interposer 200 is flipped, and UBM layers 250 are formed over a second surface 201b of the silicon oxide interposer 200, in which the second surface 201b of the silicon oxide interposer 200 is opposite to the first surface 201a of the silicon oxide interposer 200. The UBM layers 250 are electrically coupled to the conductive TVs 210a and 210b. The usable materials of the UBM layers 250 include copper or copper alloys. However, other metals, such as silver, gold, aluminum, or combinations thereof, may also be included. In some embodiments, the UBM layers 250 are formed using a sputtering method. In certain embodiments, a PVD or electroplating method may be used. After the UBM layers 250 are formed, conductive bumps 260, such as Sn/Pb or Sn/Ag solder bumps, are formed over the UBM layers 250, and are electrically coupled to the conductive TVs 210a and 210b, thus forming a device (such as a 3DIC CoWoS packaging structure or system) similar to that shown in FIG. 1B. In some embodiments, the conductive bumps 260 may be micro bumps or C4 bumps.

Figure 3:
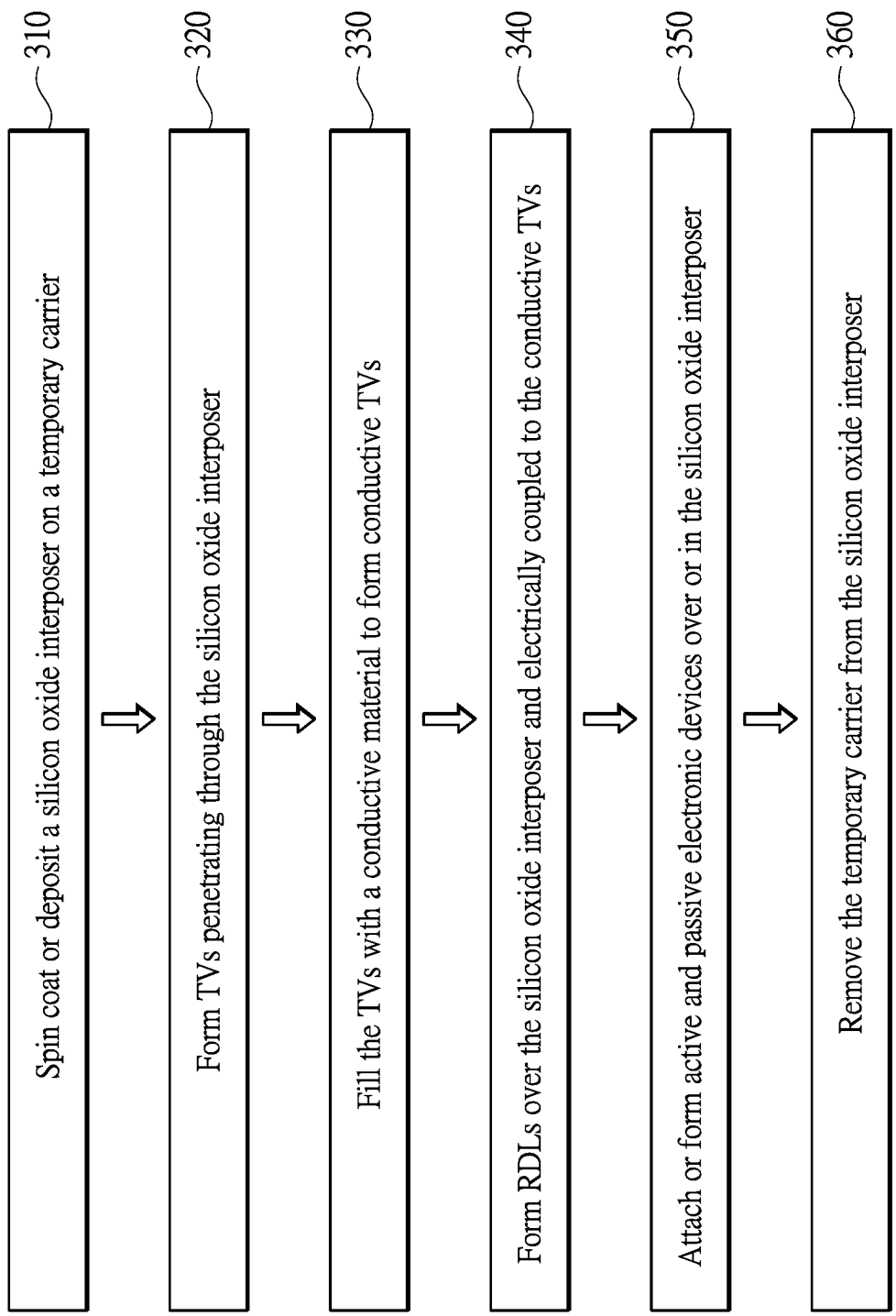
FIG. 3 is a flow chart of a method for fabricating a packaging structure in accordance with various embodiments.

Referring to FIG. 3 with FIG. 2A-FIG. 2I, FIG. 3 is a flow chart of a method for fabricating a device (such as a 3DIC CoWoS packaging structure or system) in accordance with various embodiments. The method begins at operation 310, where a silicon oxide interposer 200 is spin coated or deposited on a temporary carrier 202, as shown in FIG. 2A. The silicon oxide interposer 200 is deposited on the temporary carrier 202 using a spin coated or deposition process, such as an SOG process or SOD process with a low temperature (<400° C.) curing process, a PECVD process, a APCVD process, a SACVD process, a HDPCVD process, a LPCVD process or an ALD process, etc. At operation 320, TVs 210 penetrating through the silicon oxide interposer 200 are formed, as shown in FIG. 2C. At operation 330, a conductive material fills the TVs 210 to form conductive TVs 210a and 210b, as shown in FIG. 2D. In some embodiments, copper is used to fill the TVs 210 by ECP. However, embodiments of the present disclosure are not so limited. The conductive TVs 210a and 210b can be formed using any suitable conductive material and processes. At operation 340, RDLs are formed over a first surface 201a of the silicon oxide interposer 200, and are electrically coupled or connected to the conductive TVs 210a, as shown in FIG. 2E. The material forming the RDLs 220 is a metallic material, such as aluminum or copper. In some embodiments, copper is sputtered or electroplated and patterned on the first surface 201a of the silicon oxide interposer 200 to form the RDLs 220. At operation 350, both active and passive electronic devices are optionally attached or formed over or in the silicon oxide interposer 200 using the conductive TVs 210 and the RDLs 220. At operation 360, the temporary carrier 202 is removed from a second surface 201b of the silicon oxide interposer 200 opposite to the first surface 201a. As described above, the temporary carrier 202 may be removed after operation 340 or 350.

Figure 4:
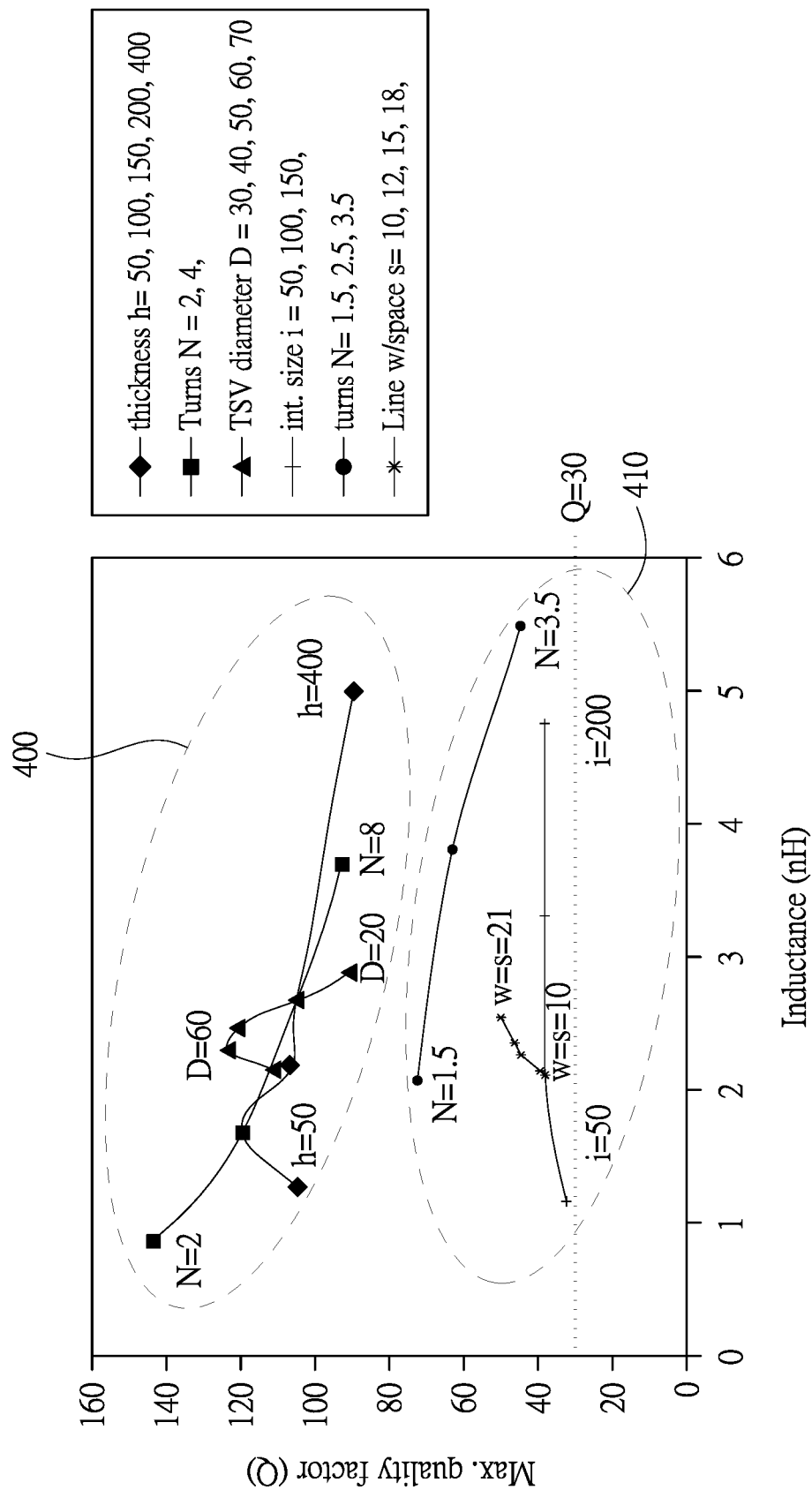
FIG. 4 is a graph showing quality factor (Q-factor) benchmark calculations for both three-dimensional (3D) vertical inductors and two-dimensional (2D) planar inductors in accordance with some embodiments.

FIG. 4 is a graph showing Q-factor benchmark calculations for both 3D vertical inductors and 2D planar inductors in accordance with some embodiments. As shown in FIG. 4, the 3D vertical inductors 400 and the 2D planar inductors 410 formed in the silicon oxide interposer of the embodiments all show very high RF Q-factors, in which the RF Q-factors of the 3D vertical inductors 400 are greater than 80, and the RF Q-factors of the 2D planar inductors 410 are greater than 30. In contrast, the RF Q-factors of 3D vertical inductors formed in a silicon interposer are smaller than about 25, and the RF Q-factors of 2D planar inductors formed in the silicon interposer are smaller than about 32. Thus, it is clear that the silicon oxide interposer of the embodiments can provide excellent isolation and very little transmission signal loss.

In accordance with an embodiment, the present disclosure discloses a device including electrically conductive TVs, RDLs, and a silicon oxide interposer with no metal ingredients. The silicon oxide interposer has a first surface and a second surface opposite to the first surface. The conductive TVs penetrate through the silicon oxide interposer. The electrically interconnected RDLs are disposed over the first surface of the silicon oxide interposer, and are electrically coupled or connected to a number of the conductive TVs.

In accordance with another embodiment, the present disclosure discloses a device including conductive TVs, RDLs, a polymer insulating layer, electrically conductive interconnects, a UBM layer, and a silicon oxide interposer with no metal ingredients. The silicon oxide interposer has a first surface and a second surface opposite to the first surface. The conductive TVs penetrate through the silicon oxide interposer. The electrically conductive RDLs are disposed over the first surface of the silicon oxide interposer, and are electrically coupled or connected to a number of the electrically conductive TVs. The polymer insulating layer covers the RDLs. The interconnects are disposed in the polymer insulating layer, and are electrically coupled or connected to the conductive TVs. The UBM layer is disposed over the second surface of the silicon oxide interposer, and is electrically coupled or connected to each of the conductive TVs.

In accordance with yet another embodiment, the present disclosure discloses a method. In this method, a silicon oxide interposer is spin coated or deposited on a temporary carrier. TVs penetrating through the silicon oxide interposer are formed. A conductive material fills the TVs to form conductive TVs. RDLs are formed over a first surface of the silicon oxide interposer, and are electrically coupled or connected to a number of the conductive TVs. The temporary carrier is removed from a second surface of the silicon oxide interposer opposite to the first surface.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for making an interposer for high frequency radio frequency (RF) system, comprising steps of:
    forming a silicon oxide layer on a temporary carrier;
    forming through vias (TVs) penetrating through the silicon oxide layer;
    filling the TVs with a conductive material to form conductive filled vias in the silicon oxide layer;
    wherein after the formed conductive filled vias in the silicon oxide layer, forming redistribution lines (RDLs) over a first surface of the silicon oxide layer and electrically coupled to the formed conductive filled vias; and
    removing the temporary carrier from a second surface of the silicon oxide layer opposite to the first surface.

2. The method of claim 1, wherein the forming of the silicon oxide layer further comprises forming the silicon oxide layer using a spin on glass (SOG) process and a curing process.

3. The method of claim 1, further comprising:
    forming an under bump metallurgy (UBM) layer contacting the conductive material of the conductive filled vias, wherein an interface between the under bump metallurgy layer and the conductive material of the conductive filled vias is coplanar with the second surface of the silicon oxide layer.

4. The method of claim 1, wherein the forming of the silicon oxide layer comprises forming the silicon oxide layer by a deposition process.

5. The method of claim 1, wherein the forming of the redistribution lines further forms an interface between each of the redistribution lines and the conductive material of the conductive filled vias, and the interface is coplanar with a top surface of the silicon oxide layer.

6. The method of claim 1, further comprising:
    forming a conductive element on the second surface of the silicon oxide layer, wherein the forming of the conductive element comprises electrically connecting the conductive element to one of the redistribution lines through the conductive material of the conductive filled vias.

7. The method of claim 1, wherein the forming of the TVs is by a deep reactive-ion etching (DRIE) process.

8. The method of claim 1, wherein the forming of the TVs is by a metal hard mask etching process.

9. The method of claim 1, wherein the forming of the silicon oxide layer further comprises forming the silicon oxide layer using a spin on dielectric (SOD) process and a curing process.

10. The method of claim 1, wherein the forming of the TVs is by an inductively couple plasma (ICP) etching process.

11. A method for making an interposer for high frequency radio frequency (RF) system, comprising steps of:
    spin coating a spin on glass (SOG) or spin on dielectric (SOD) material on a temporary carrier;
    curing the SOG or SOD material to form a silicon oxide layer on the temporary carrier;
    etching the silicon oxide layer to form through vias (TVs) penetrating through the silicon oxide layer, wherein the step of etching the silicon oxide layer stops when bottoms of the TVs reach a top surface of the temporary carrier;
    filling the TVs with a conductive material to form conductive filled vias;
    forming redistribution lines (RDLs) over a first surface of the silicon oxide layer and electrically coupled to a number of the conductive filled vias; and
    removing the temporary carrier from a second surface of the silicon oxide layer opposite to the first surface of the silicon oxide layer.

12. The method of claim 11, wherein the forming of the redistribution lines further forms an interface between each of the redistribution lines and the conductive material of the conductive filled vias, and the interface is coplanar with a top surface of the silicon oxide layer.

13. The method of claim 11, further comprising:
    forming an under bump metallurgy (UBM) layer contacting the conductive material of the conductive filled vias, wherein an interface between the under bump metallurgy layer and the conductive material of the conductive filled vias is coplanar with the second surface of the silicon oxide layer.

14. A method for making an interposer for high frequency radio frequency (RF) system, comprising steps of:
    forming a silicon oxide layer on a temporary carrier;
    etching the silicon oxide layer to form openings extending through the silicon oxide layer;
    depositing a conductive material in the openings to form conductive filled vias;
    forming redistribution lines (RDLs) over a first surface of the silicon oxide layer and electrically coupled to a number of the conductive filled vias; and
    removing the temporary carrier from a second surface of the silicon oxide layer opposite to the first surface, such that the second surface of the silicon oxide layer is exposed.

15. The method of claim 14, wherein forming the silicon oxide layer comprises:
    spin-coating a liquid mixture of silicon dioxide in a solvent on the temporary carrier; and
    curing the liquid mixture of silicon dioxide to evaporate the solvent.

16. The method of claim 14, wherein after the removing of the temporary carrier from the second surface of the silicon oxide layer, further forming under bump metallurgy (UBM) structures on the second surface of the silicon oxide layer.

17. The method of claim 16, further comprising:
   forming conductive bumps on the under bump metallurgy structures, respectively.

18. The method of claim 16, wherein an interface between the under bump metallurgy structures and the conductive filled vias is coplanar with the second surface of the silicon oxide layer.

19. The method of claim 14, wherein the removing of the temporary carrier from the second surface of the silicon oxide layer comprises exposing the conductive filled vias.

20. The method of claim 14, wherein the forming of the silicon oxide layer further comprises forming the silicon oxide layer using a spin on glass (SOG) process and a curing process.

* * * * *